(12) United States Patent
Conley

(10) Patent No.: US 6,828,044 B2
(45) Date of Patent: Dec. 7, 2004

(54) DOPANT IN AN ELECTROLUMINESCENT DEVICE

(75) Inventor: Scott R. Conley, Rochester, NY (US)

(73) Assignee: Eastman Kodak Company, Rochester, NY (US)

(*) Notice: Subject to any disclaimer, the term of this patent is extended or adjusted under 35 U.S.C. 154(b) by 0 days.

(21) Appl. No.: 10/280,373

(22) Filed: Oct. 25, 2002

(65) Prior Publication Data
US 2004/0081853 A1 Apr. 29, 2004

(51) Int. Cl.[7] .............................................. H05B 33/14
(52) U.S. Cl. ...................... 428/690; 428/704; 428/917; 313/504; 313/506; 257/40; 257/103; 252/301.16; 252/301.26; 252/301.21; 252/301.32; 252/301.35
(58) Field of Search ................................ 428/690, 917, 428/704; 313/504, 506; 257/40, 103; 252/301.16, 301.26, 301.21, 301.32, 301.35

(56) References Cited

U.S. PATENT DOCUMENTS 5,935,721 A * 8/1999 Shi et al. ................... 428/690

2002/0041976 A1   4/2002   Anderson et al.
2003/0105343 A1   6/2003   Taylor et al.

FOREIGN PATENT DOCUMENTS

| JP | 93109485  | 4/1993  |
| JP | 98073936  | 3/1998  |
| JP | 10-340786 | 12/1998 |
| JP | 00192028  | 7/2000  |
| JP | 01196182  | 7/2001  |

OTHER PUBLICATIONS

Tanslation of Okutsu et al. (Jp–10–340786).*
Abstract of JP10340786 (as listed above).

* cited by examiner

Primary Examiner—Deborah Jones
Assistant Examiner—Ling Xu
(74) Attorney, Agent, or Firm—Arthur E. Kluegel

(57) ABSTRACT

Disclosed is an organic light emitting diode device containing a light emitting layer (LEL) comprising a host and a blue light emitting dopant wherein the dopant comprises a 2-(3-aminophenyl)-benzofuran or 2-(4-aminophenyl)-benzofuran compound. The dopant provides improved luminance and luminance yield.

19 Claims, 1 Drawing Sheet

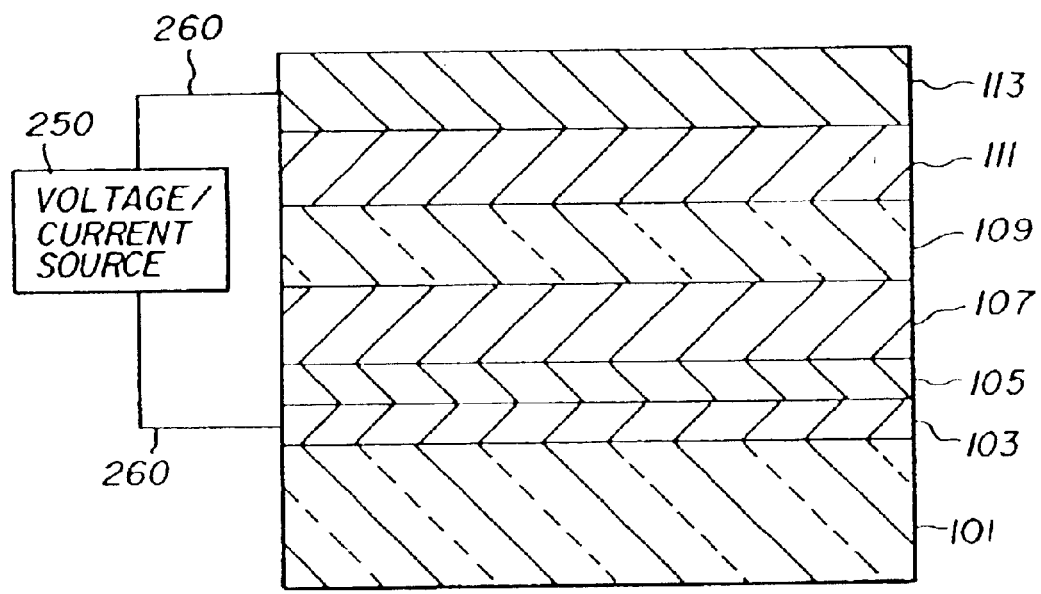

DOPANT IN AN ELECTROLUMINESCENT DEVICE

FIELD OF INVENTION

This invention relates to organic electroluminescent (EL) devices comprising a light emitting layer (LEL) containing a host and a dopant wherein the dopant comprises a 2-(3-aminophenyl)-benzofuran or 2-(4-aminophenyl)benzofuran compound.

BACKGROUND OF THE INVENTION

While organic electroluminescent (EL) devices have been known for over two decades, their performance limitations have represented a barrier to many desirable applications. In simplest form, an organic EL device is comprised of an anode for hole injection, a cathode for electron injection, and an organic medium sandwiched between these electrodes to support charge recombination that yields emission of light. These devices are also commonly referred to as organic light-emitting diodes, or OLEDs. Representative of earlier organic EL devices are Gurnee et al. U.S. Pat. No. 3,172,862, issued Mar. 9, 1965; Gurnee U.S. Pat. No. 3,173,050, issued Mar. 9, 1965; Dresner, "Double Injection Electroluminescence in Anthracene", RCA Review, Vol. 30, pp. 322–334, 1969; and Dresner U.S. Pat. No. 3,710,167, issued Jan. 9, 1973. The organic layers in these devices, usually composed of a polycyclic aromatic hydrocarbon, were very thick (much greater than 1 μm). Consequently, operating voltages were very high, often >100V.

More recent organic EL devices include an organic EL element consisting of extremely thin layers (e.g. <1.0 μm) between the anode and the cathode. Herein, the term "organic EL element" encompasses the layers between the anode and cathode electrodes. Reducing the thickness lowered the resistance of the organic layer and has enabled devices that operate much lower voltage. In a basic two-layer EL device structure, described first in U.S. Pat. No. 4,356,429, one organic layer of the EL element adjacent to the anode is specifically chosen to transport holes, therefore, it is referred to as the hole-transporting layer, and the other organic layer is specifically chosen to transport electrons, referred to as the electron-transporting layer. Recombination of the injected holes and electrons within the organic EL element results in efficient electroluminescence.

There have also been proposed three-layer organic EL devices that contain an organic light-emitting layer (LEL) between the hole-transporting layer and electron-transporting layer, such as that disclosed by Tang et al [J. Applied Physics, Vol. 65, Pages 3610–3616, 1989]. The light-emitting layer commonly consists of a host material doped with a guest material. Still further, there has been proposed in U.S. Pat. No. 4,769,292 a four-layer EL element comprising a hole-injecting layer (HIL), a hole-transporting layer (HTL), a light-emitting layer (LEL) and an electron transport/injection layer (ETL). These structures have resulted in improved device efficiency.

A common dopant used in the LEL is 2,5,8,11-tetra-tert-butylperylene (TBP). In addition, light emission in the blue color region has been shown, such as in US2002-041976, JP2001-196182, JPO5-109485, and JP2000-192028, by using a non-aminophenyl substituted benzofuran in the LEL. Notwithstanding the foregoing developments, there are continuing needs for organic EL device components that can further increase blue luminance and luminance yield.

SUMMARY OF THE INVENTION

The invention provides an organic light emitting diode device containing a light emitting layer (LEL) comprising a host and a blue light emitting dopant wherein the dopant comprises a 2-(3-aminophenyl)-benzofuran or 2-(4-aminophenyl)-benzofuran compound and an imaging device containing the same. Also provided is a light emitting device, and a static or motion imaging device, and a method of emitting light.

Dopants of the invention enable improved luminance and luminance yield.

BRIEF DESCRIPTION OF THE DRAWINGS

FIG. 1 shows a cross-section of an OLED device of this invention.

DETAILED DESCRIPTION OF THE INVENTION

The OLED device of the invention is summarized above as an organic light emitting diode device containing a light emitting layer (LEL) comprising a host and a blue light emitting dopant wherein the dopant comprises a 2-(3-aminophenyl)-benzofuran or 2-(4-aminophenyl)-benzofuran compound. As more fully explained hereinafter, the host functions as an initial energy absorber that transfers that energy to the dopant or guest material as the primary light emitter of a desired color, in this case, blue. Typically, the dopant is present in much smaller amounts than the host and comprises 0.01 to 20% by weight of the host in the light emitting layer (LEL) and usually 0.1–5.0 wt %.

Suitably, the dopant comprises a benzofuran as represented by formula I:

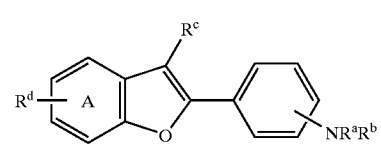

wherein $R^a$ and $R^b$ independently represent an aryl or heteroaryl group and the nitrogen to which they are bonded is located at the 3- or 4-position of the phenyl ring; and $R^c$ represents hydrogen or an alkyl, aryl or heteroaryl group; and $R^d$ represents one or more hydrogen, alkyl, substituted nitrogen, or aryl or heteroaryl groups which may join to form a ring fused to ring A.

The dopant may comprise a bis-2-(4-aminophenyl)-benzofuran as represented by formula II:

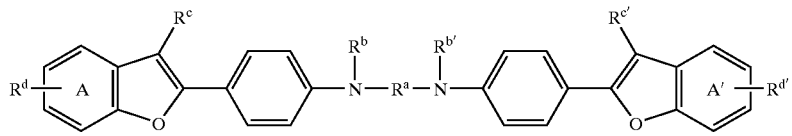

II wherein

R$^a$, R$_b$, and R$_{b'}$ independently represent an aryl or heteroaryl group; and R$^c$, R$^{c'}$, independently represent hydrogen or an alkyl, aryl or heteroaryl group; and R$^d$, and R$_{d'}$ independently represent one or more hydrogen or alkyl, substituted nitrogen, aryl or heteroaryl groups which may form a ring fused to ring A or A'.

The dopant of Formula II is desirable where R$^c$ and R$^{c'}$ are phenyl groups and/or where R$^a$ is a 4,4'-biphenyl group, especially when R$^b$ and R$^{b'}$ are phenyl groups.

In a useful embodiment, the dopant comprises a benzofuran as represented by formula III:

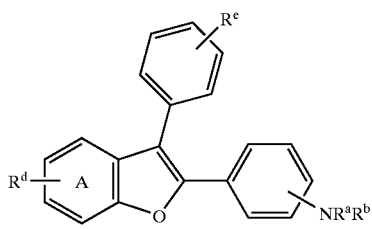

III wherein

R$^a$ and R$^b$ independently represent an aryl or heteroaryl group;

R$^d$ represents one or more hydrogen or alkyl, substituted nitrogen, aryl or heteroaryl groups two of which may form a ring fused to ring A; and R$^e$ represents hydrogen or up to 4 groups selected from alkyl groups of from 1 to 24 carbon atoms, aryloxy, alkylamino, or arylamino groups of from 1 to 24 carbon atoms, fluorine, chlorine, bromine and cyano groups.

In particular, the dopant comprises a benzofuran as represented by formula IV:

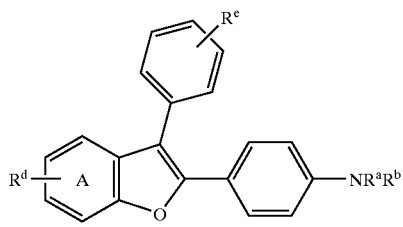

IV wherein

R$^a$ and R$^b$ independently represent an aryl or heteroaryl group;

R$^d$ represents one or more hydrogen or alkyl, substituted nitrogen, aryl or heteroaryl groups which may form a ring fused to ring A; and R$^e$ represents hydrogen or up to 4 groups selected from alkyl groups of from 1 to 24 carbon atoms, aryloxy, alkylamino, or arylamino groups of from 1 to 24 carbon atoms, fluorine, chlorine, bromine and cyano groups.

The benefit imparted by the dopant does not appear to be host specific. Desirable hosts include those based on an anthracene compound or a dicarbazole-biphenyl compound. Particular examples of hosts are 2-tert-butyl-9,10-di-(2-naphthyl)anthracene and 4,4'-N,N'-dicarbazole-1,1'-biphenyl (CBP). It is desirable that the device employ an LEL that contains a host compound having the formula:

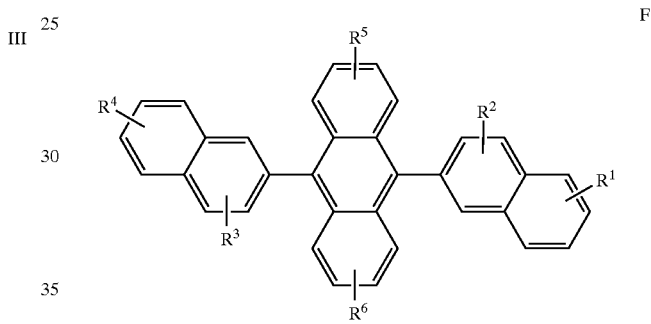

F wherein: $R^1$, $R^2$, $R^3$, $R^4$, $R^5$, and $R^6$ represent hydrogen or one or more substituents on the ring to which it is attached selected from the following groups:

Group 1: H and an alkyl or alkoxy group;

Group 2: a ring group;

Group 3: the atoms necessary to complete a carbocyclic fused ring group;

Group 4: the atoms necessary to complete a heterocyclic fused ring group;

Group 5: an alkoxyamino, alkylamino, and arylamino group; and

Group 6: fluorine, chlorine, bromine and cyano groups.

A light emitting device may contain the OLED device of the invention and may comprise a static or motion imaging device, such as a television, cell phone, DVD player, or computer monitor. The method of emitting light comprises subjecting the device of the invention to an applied voltage, as more fully explained hereafter.

Illustrative examples of useful 2-(3-aminophenyl)-benzofuran or 2-(4-aminophenyl)-benzofuran compounds in the present invention are the following:

Inv-1
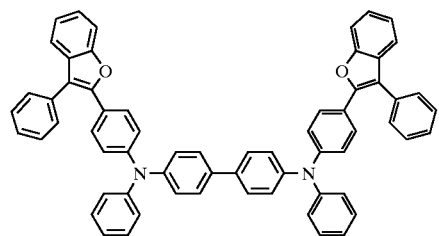
Inv-2
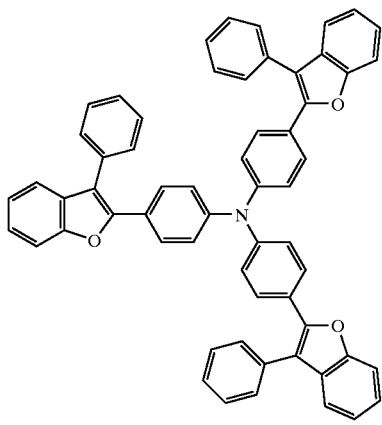
Inv-3
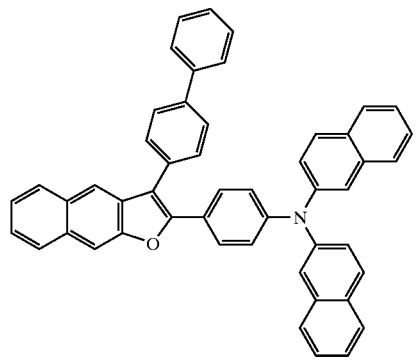
Inv-4
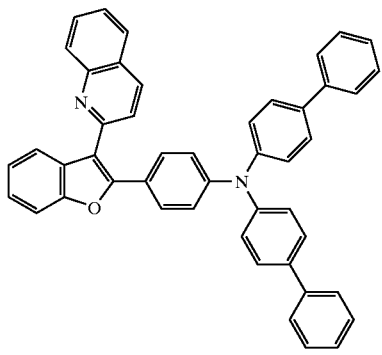
Inv-5
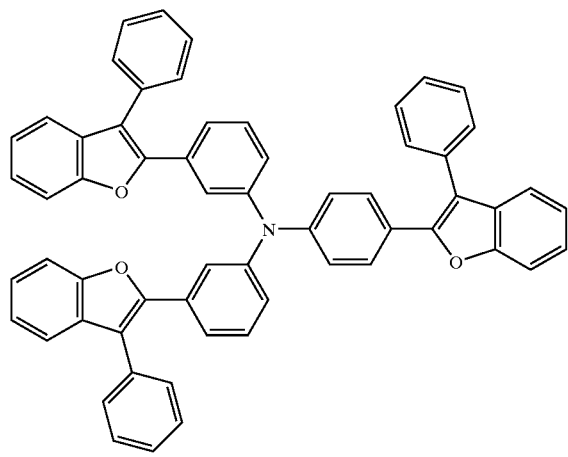
Inv-6
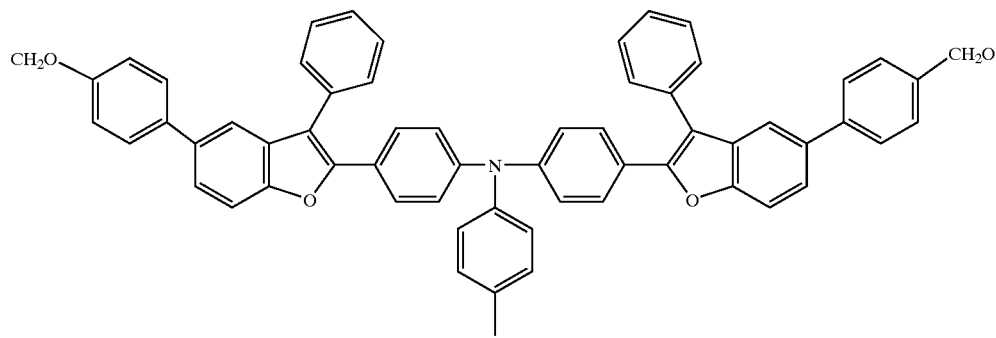

-continued

Inv-7

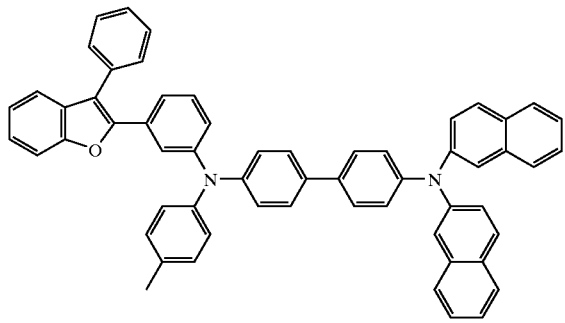

Inv-8

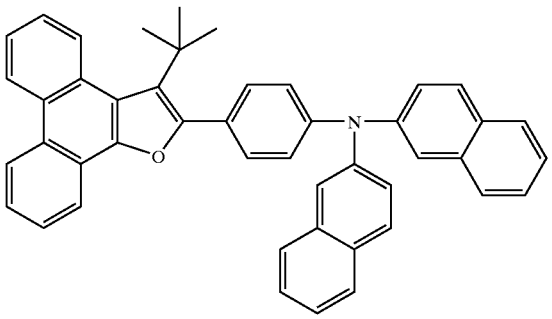

Unless otherwise specifically stated, use of the term "substituted" or "substituent" means any group or atom other than hydrogen. Additionally, when the term "group" is used, it means that when a substituent group contains a substitutable hydrogen, it is also intended to encompass not only the substituent's unsubstituted form, but also its form further substituted with any substituent group or groups as herein mentioned, so long as the substituent does not destroy properties necessary for device utility. Suitably, a substituent group may be halogen or may be bonded to the remainder of the molecule by an atom of carbon, silicon, oxygen, nitrogen, phosphorous, sulfur, selenium, or boron. The substituent may be, for example, halogen, such as chloro, bromo or fluoro; nitro; hydroxyl; cyano; carboxyl; or groups which may be further substituted, such as alkyl, including straight or branched chain or cyclic alkyl, such as methyl, trifluoromethyl, ethyl, t-butyl, 3-(2,4-di-t-pentylphenoxy) propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy)ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, pdodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group consisting of oxygen, nitrogen, sulfur, phosphorous, or boron, such as 2-furyl, 2-thienyl, 2-benzimidazolyloxy or 2-benzothiazolyl; and silyloxy, such as trimethylsilyloxy.

If desired, the substituents may themselves be further substituted one or more times with the described substituent groups. The particular substituents used may be selected by those skilled in the art to attain the desired desirable properties for a specific application and can include, for example, electron-withdrawing groups, electron-donating groups, and steric groups. When a molecule may have two or more substituents, the substituents may be joined together to form a ring such as a fused ring unless otherwise provided. Generally, the above groups and substituents thereof may include those having up to 48 carbon atoms, typically 1 to 36 carbon atoms and usually less than 24 carbon atoms, but greater numbers are possible depending on the particular substituents selected.

General Device Architecture

The present invention can be employed in most OLED device configurations. These include very simple structures comprising a single anode and cathode to more complex devices, such as passive matrix displays comprised of orthogonal arrays of anodes and cathodes to form pixels, and active-matrix displays where each pixel is controlled independently, for example, with thin film transistors (TFTs).

There are numerous configurations of the organic layers wherein the present invention can be successfully practiced. A typical structure is shown in FIG. 1 and is comprised of a substrate 101, an anode 103, a hole-injecting layer 105, a hole-transporting layer 107, a light-emitting layer 109, an electron-transporting layer 111, and a cathode 113. These layers are described in detail below. Note that the substrate may alternatively be located adjacent to the cathode, or the substrate may actually constitute the anode or cathode. The organic layers between the anode and cathode are conveniently referred to as the organic EL element. Also, the total combined thickness of the organic layers is preferably less than 500 nm.

The anode and cathode of the OLED are connected to a voltage/current source 250 through electrical conductors 260. The OLED is operated by applying a potential between the anode and cathode such that the anode is at a more positive potential than the cathode. Holes are injected into the organic EL element from the anode and electrons are injected into the organic EL element at the anode. Enhanced device stability can sometimes be achieved when the OLED is operated in an AC mode where, for some time period in the cycle, the potential bias is reversed and no current flows. An example of an AC driven OLED is described in U.S. Pat. No. 5,552,678.

Substrate

The OLED device of this invention is typically provided over a supporting substrate 101 where either the cathode or anode can be in contact with the substrate. The electrode in contact with the substrate is conveniently referred to as the bottom electrode. Conventionally, the bottom electrode is the anode, but this invention is not limited to that configuration. The substrate can either be light transmissive or opaque, depending on the intended direction of light emission. The light transmissive property is desirable for viewing the EL emission through the substrate. Transparent glass or plastic is commonly employed in such cases. The substrate may be a complex structure comprising multiple layers of materials. This is typically the case for active matrix substrates wherein TFTs are provided below the OLED layers. It is still necessary that the substrate, at least in the emissive pixilated areas, be comprised of largely transparent materials such as glass or polymers. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, silicon, ceramics, and circuit board materials. Again, the substrate may be a complex structure comprising multiple layers of materials such as found in active matrix TFT designs. Of course it is necessary to provide in these device configurations a light-transparent top electrode.

Anode

When EL emission is viewed through anode 103, the anode should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode 103. For applications where EL emission is viewed only through the cathode electrode, the transmissive characteristics of anode are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes. Optionally, anodes may be polished prior to application of other layers to reduce surface roughness so as to minimize shorts or enhance reflectivity.

Hole-Injecting Layer (HIL)

While not always necessary, it is often useful that a hole-injecting layer 105 be provided between anode 103 and hole-transporting layer 107. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, plasma-deposited fluorocarbon polymers as described in U.S. Pat. No. 6,208,075, and some aromatic amines, for example, m-MTDATA (4,4',4"-tris[(3-methylphenyl) phenylamino]triphenylamine). Alternative hole-injecting materials reportedly useful in organic EL devices are described in EP 0 891 121 A1 and EP 1 029 909 A1.

Hole-Transporting Layer (HTL)

The hole-transporting layer 107 of the organic EL device contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, di aryl amine, triarylamine, or a polymeric aryl amine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. No. 3,567,450 and U.S. Pat. No. 3,658,520.

A more preferred class of aromatic tertiary amines are those which include at least two aromatic tertiary amine moieties as described in U.S. Pat. No. 4,720,432 and U.S. Pat. No. 5,061,569. Such compounds include those represented by structural formula (A).

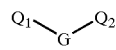

A wherein $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural formula (A) and containing two triarylamine moieties is represented by structural formula (B):

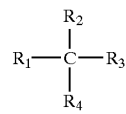

B where $R_1$ and $R_2$ each independently represents a hydrogen atom, an aryl group, or an alkyl group or $R_1$ and $R_2$ together represent the atoms completing a cycloalkyl group; and $R_3$ and $R_4$ each independently represents an aryl group, which is in turn substituted with a diaryl substituted amino group, as indicated by structural formula (C):

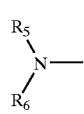

C wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by formula (C), linked through an arylene group. Useful tetraaryldiamines include those represented by formula (D).

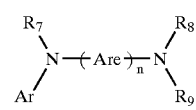

D wherein each Are is an independently selected arylene group, such as a phenylene or anthracene moiety, n is an integer of from 1 to 4, and Ar, $R_7$, $R_8$, and $R_9$ are independently selected aryl groups. In a typical embodiment, at least one of Ar, $R_7$, $R_8$, and $R_9$ is a polycyclic fused ring structure, e.g., a naphthalene The various alkyl, alkylene, aryl, and arylene moieties of the foregoing structural formulae (A), (B), (C), (D), can each in turn be substituted. Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are usually phenyl and phenylene moieties.

The hole-transporting layer can be formed of a single or a mixture of aromatic tertiary amine compounds. Specifically, one may employ a triarylamine, such as a triarylamine satisfying the formula (B), in combination with a tetraaryldiamine, such as indicated by formula (D). When a triarylamine is employed in combination with a tetraaryldiamine, the latter is positioned as a layer interposed between the triarylamine and the electron injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N '-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis {N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene
4,4',4"-tris[(3-methylphenyl)phenylamino]triphenylamine Another class of useful hole-transporting materials includes polycyclic aromatic compounds as described in EP 1 009 041. Tertiary aromatic amines with more than two amine groups may be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in U.S. Pat. Nos. 4,769,292 and 5,935,721, the light-emitting layer (LEL) 109 of the organic EL element includes a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes (e.g., poly(p-phenylenevinylene), PPV) can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in U.S. Pat. No. 4,768,292, U.S. Pat. No. 5,141,671, U.S. Pat. No. 5,150,006, U.S. Pat. No. 5,151,629, U.S. Pat. No. 5,405,709, U.S. Pat. No. 5,484,922, U.S. Pat. No. 5,593,788, U.S. Pat. No. 5,645,948, U.S. Pat. No. 5,683,823, U.S. Pat. No. 5,755,999, U.S. Pat. No. 5,928,802, U.S. Pat. No. 5,935,720, U.S. Pat. No. 5,935,721, and U.S. Pat. No. 6,020,078.

Metal complexes of 8-hydroxyquinoline and similar derivatives (Formula E) constitute one class of useful host compounds capable of supporting electroluminescence, and are particularly suitable for light emission of wavelengths longer than 500 nm, e.g., green, yellow, orange, and red.

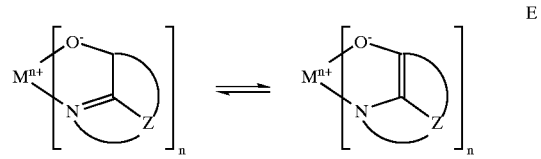

wherein
M represents a metal;
n is an integer of from 1 to 4; and
Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato) aluminum(III)]

CO-2: Magnesium bisoxine [alias, bis(8-quinolinolato) magnesium(II)]

CO-3: Bis[benzo {f}-8-quinolinolato]zinc (II)

CO-4: Bis(2-methyl-8-quinolinolato)aluminum(III)-μ-oxo-bis(2-methyl-8-quinolinolato) aluminum(III)

CO-5: Indium trisoxine [alias, tris(8-quinolinolato) indium]

CO-6: Aluminum tris(5-methyloxine) [alias, tris(5-methyl-8-quinolinolato) aluminum(III)]

CO-7: Lithium oxine [alias, (8-quinolinolato)lithium(I)]

CO-8: Gallium oxine [alias, tris(8-quinolinolato)gallium (III)]

CO-9: Zirconium oxine [alias, tetra(8-quinolinolato) zirconium(IV)]

Derivatives of 9,10-di-(2-naphthyl)anthracene (Formula F) constitute one class of useful hosts capable of supporting electroluminescence, and are particularly suitable for light emission of wavelengths longer than 400 nm, e.g., blue, green, yellow, orange or red.

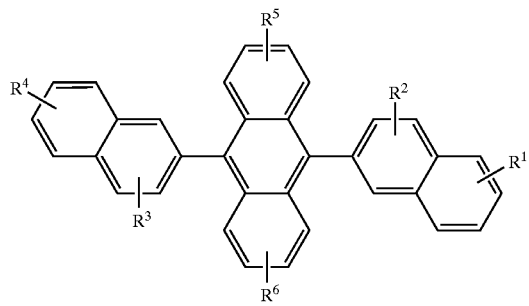

F wherein: $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl; pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

Illustrative examples include 9,10-di-(2-naphthyl) anthracene and 2-t-butyl-9,10-di-(2-naphthyl)anthracene. Other anthracene derivatives can be useful as a host in the LEL, including derivatives of 9,10-bis[4-(2,2-diphenylethenyl)phenyl]anthracene.

Benzazole derivatives (Formula G) constitute another class of useful hosts capable of supporting electroluminescence, and are particularly suitable for light emission of wavelengths longer than 400 nm, e.g., blue, green, yellow, orange or red.

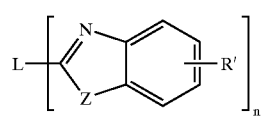

G

Where:

n is an integer of 3 to 8;

Z is O, NR or S; and

R and R' are individually hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring;

L is a linkage unit consisting of alkyl, aryl, substituted alkyl, or substituted aryl, which conjugately or unconjugately connects the multiple benzazoles together. An example of a useful benzazole is 2,2', 2"-(1,3,5-phenylene)tris[1-phenyl-1H-benzimidazole].

Dopants represented in Formula (1) may also be used in combination with other light-emitting dopants to achieve different colors (i.e. white), increase efficiency, or increase stability. Fluorescent dopants to be used in combination with dopants represented in Formula (1) include, but are not limited to, derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, and carbostyryl compounds. Illustrative examples of useful dopants include, but are not limited to, the following:

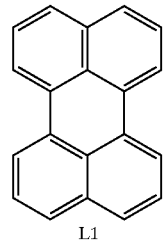

L1

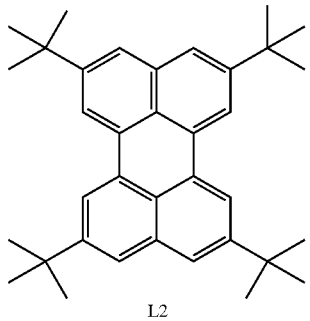

L2

-continued

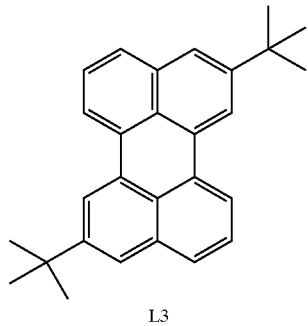

L3

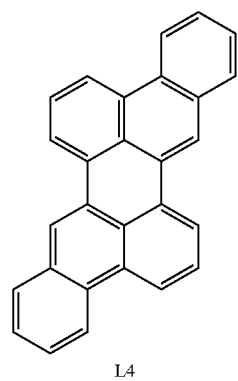

L4

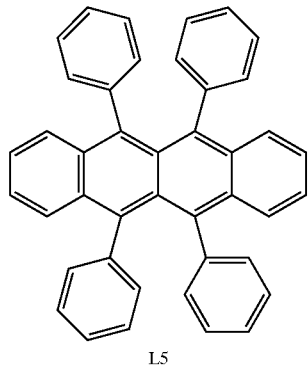

L5

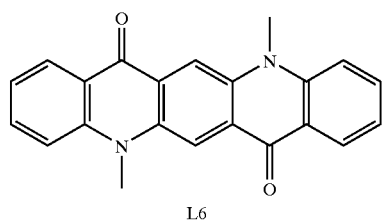

L6

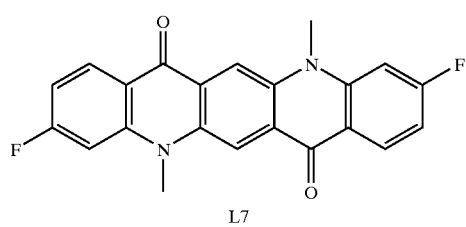

L7

-continued

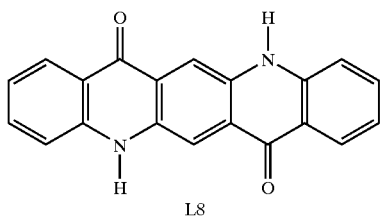

L8

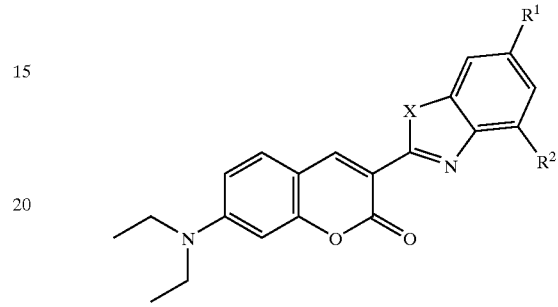

| | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |

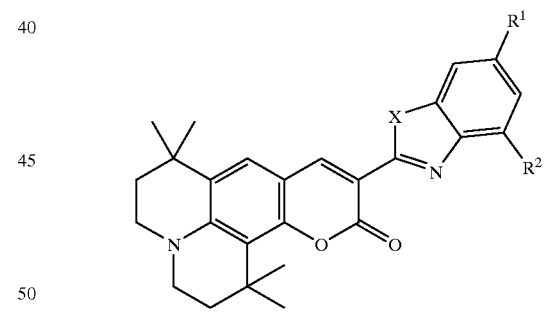

| | X | R1 | R2 |
|---|---|---|---|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |

-continued

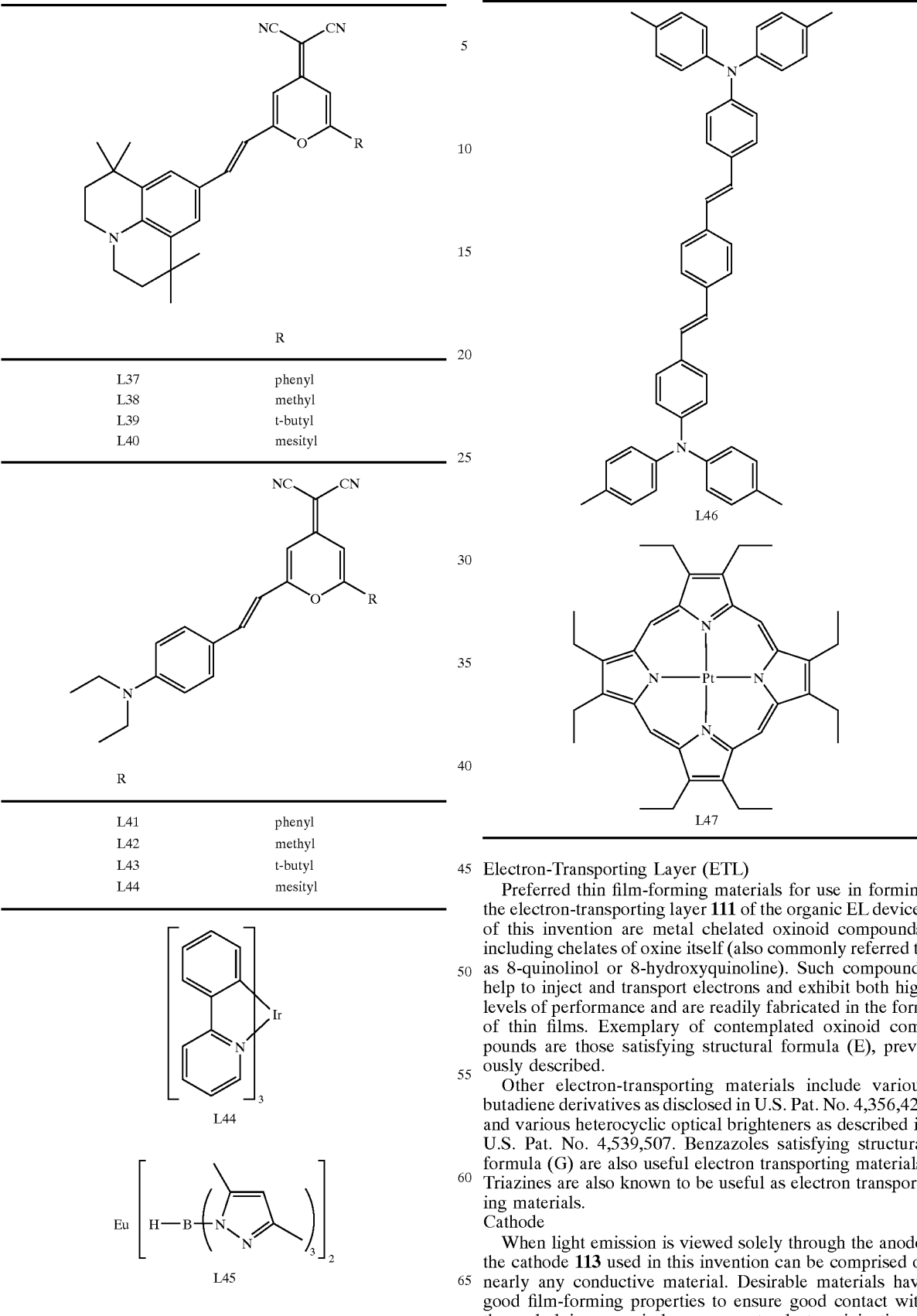

| | |
|---|---|
| L37 | phenyl |
| L38 | methyl |
| L39 | t-butyl |
| L40 | mesityl |

| | |
|---|---|
| L41 | phenyl |
| L42 | methyl |
| L43 | t-butyl |
| L44 | mesityl |

L44

L45

L46

L47

Electron-Transporting Layer (ETL)

Preferred thin film-forming materials for use in forming the electron-transporting layer 111 of the organic EL devices of this invention are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural formula (E), previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural formula (G) are also useful electron transporting materials. Triazines are also known to be useful as electron transporting materials.

Cathode

When light emission is viewed solely through the anode, the cathode 113 used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprising a thin electron-injection layer (EIL) in contact with the organic layer (e.g., ETL) which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861; 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 4,885,211, U.S. Pat. No. 5,247,190, JP 3,234,963, U.S. Pat. No. 5,703,436, U.S. Pat. No. 5,608,287, U.S. Pat. No. 5,837,391, U.S. Pat. No. 5,677,572, U.S. Pat. No. 5,776,622, U.S. Pat. No. 5,776,623, U.S. Pat. No. 5,714,838, U.S. Pat. No. 5,969,474, U.S. Pat. No. 5,739,545, U.S. Pat. No. 5,981,306, U.S. Pat. No. 6,137,223, U.S. Pat. No. 6,140,763, U.S. Pat. No. 6,172,459, EP 1 076 368, U.S. Pat. No. 6,278,236, and U.S. Pat. No. 6,284,3936. Cathode materials are typically deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Other Useful Organic Layers and Device Architecture

In some instances, layers 109 and 111 can optionally be collapsed into a single layer that serves the function of supporting both light emission and electron transportation. It also known in the art that emitting dopants may be added to the hole-transporting layer, which may serve as a host. Multiple dopants may be added to one or more layers in order to create a white-emitting OLED, for example, by combining blue- and yellow-emitting materials, cyan- and red-emitting materials, or red-, green-, and blue-emitting materials. White-emitting devices are described, for example, in EP 1 187 235, US 20020025419, EP 1 182 244, U.S. Pat. No. 5,683,823, U.S. Pat. No. 5,503,910, U.S. Pat. No. 5,405,709, and U.S. Pat. No. 5,283,182.

Additional layers such as electron or hole-blocking layers as taught in the art may be employed in devices of this invention. Hole-blocking layers are commonly used to improve efficiency of phosphorescent emitter devices, for example, as in US 20020015859.

This invention may be used in so-called stacked device architecture, for example, as taught in U.S. Pat. No. 5,703,436 and U.S. Pat. No. 6,337,492.

Deposition of Organic Layers

The organic materials mentioned above are suitably deposited through sublimation, but can be deposited from a solvent with an optional binder to improve film formation. If the material is a polymer, solvent deposition is usually preferred. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. No. 5,688,551, U.S. Pat. No. 5,851,709 and U.S. Pat. No. 6,066,357) and inkjet method (U.S. Pat. No. 6,066,357).

Encapsulation

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

Optical Optimization

OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti glare or anti-reflection coatings over the display, providing a polarizing medium over the display, or providing colored, neutral density, or color conversion filters over the display. Filters, polarizers, and antiglare or anti-reflection coatings may be specifically provided over the cover or as part of the cover.

EXAMPLES

Synthesis

Example 1

Preparation of Inv-1. A mixture of 2-(4'-aminophenyl)-3-phenyl-benzofuran (5.26 mmol, 1.5 g), 4,4'-dibromobiphenyl (2.39 mmol, 0.75 g), $Pd_2(dba)_3$ (0.02 mmol, 0.022 g), (o-bp)P(t-Bu)$_2$ (0.1 mmol, 0.03 g), and NaOt-Bu (5.73 mmol, 0.55 g) in degassed toluene (2 mL) was heated to 80° C. for 3 hours. The solid product S-1 was filtered.

A mixture of S-1 (2.36 mmol, 1.7 g), para-bromotoluene (5.9 mmol, 0.73 mL), Pd(OAc)2 (0.05 mmol, 0.01 g), P(t-Bu)$_3$ (0.19 mmol, 0.04 g), and NaOt-Bu (5.9 mmol, 0.57 g) in degassed toluene (5 mL) was heated to 90° C. for 5 hours. After cooling to room temperature, ethyl acetate was added and the solids were filtered. The filtrate was purified by column chromatography (15% methylene chloride/85% heptane) to give Inv-1.

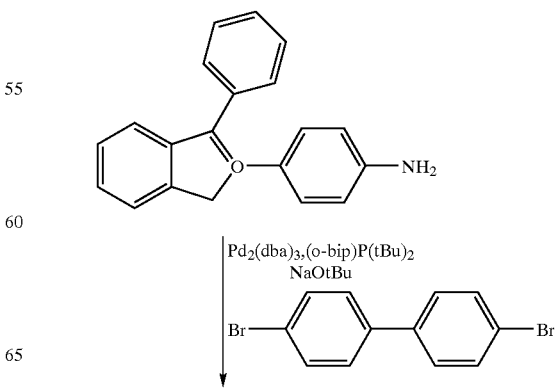

-continued

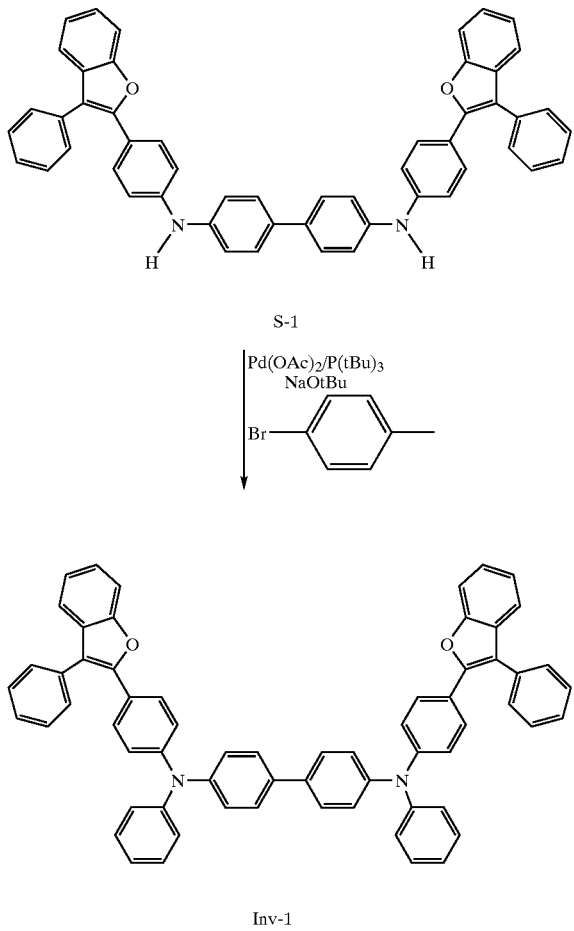

S-1

Inv-1

Device Example

Example 2

EL Device Fabrication—Inventive Example

A series of EL devices satisfying the requirements of the invention were constructed in the following manner:

A glass substrate coated with a 42 nm layer of indium-tin oxide (ITO) as the anode was sequentially ultrasonicated in a commercial detergent, rinsed in deionized water, degreased in toluene vapor and exposed to oxygen plasma for about 1 min.

a) Over the ITO was deposited a 1 nm fluorocarbon hole-injecting layer (CFx) by plasma-assisted deposition of $CHF_3$.

b) A hole-transporting layer of N,N'-di-1-naphthalenyl-N, N'-diphenyl-4,4'-diaminobiphenyl (NPB) having a thickness of 75 nm was then evaporated from a tantalum boat.

c) A 30 nm light-emitting layer of 2-tert-butyl-9,10-di-(2-naphthyl)anthracene (TBADN) and Inv-1 (see Table I for doping level) was then deposited onto the hole-transporting layer. These materials were also evaporated from tantalum boats.

d) A 45 nm electron-transporting layer of tris(8-quinolinolato)aluminum (III) ($AlQ_3$) was then deposited onto the light-emitting layer. This material was also evaporated from a tantalum boat.

e) On top of the $AlQ_3$ layer was deposited a 220 nm cathode formed of a 10:1 volume ratio of Mg and Ag.

The above sequence completed the deposition of the EL device. The device was then hermetically packaged in a dry glove box for protection against ambient environment.

A comparison device (1—1) was prepared omitting Inv-1 from the light-emitting layer and maintaining the same device architecture as the other examples. The cells thus formed were tested for luminance, luminance yield, and color, and the results are reported in Table I.

TABLE I

Evaluation Results for Inv-1 in TBADN.[a]

| Example | Type | Dopant (Conc.)[1] | W/A | Yield (cd/A) | Luminance (cd/m²) | $\lambda_{max}$ (nm) | Color |
|---|---|---|---|---|---|---|---|
| 1-1 | Comparison | (0.0%) | 0.025 | 1.50 | 299.3 | 448 | Blue |
| 1-2 | Invention | (0.25%) | 0.027 | 1.70 | 359.9 | 452 | Blue |
| 1-3 | Invention | (0.5%) | 0.028 | 1.72 | 362.3 | 452 | Blue |
| 1-4 | Invention | (1.0%) | 0.029 | 1.80 | 372.5 | 452 | Blue |
| 1-5 | Invention | (2.0%) | 0.031 | 1.66 | 374.9 | 452 | Blue |
| 1-6 | Invention | (4.0%) | 0.032 | 1.66 | 431.4 | 456 | Blue |

[a]Data reported for current density of 20 mA/cm²
[1]wt % in host

Table I shows that there is an increase of 10–20% in luminance yield for the examples of the invention vs Comparison Example 1—1. An increase of 20–44% is shown for examples 1–2 through 1–6 of the invention vs. Comparison Example 1—1.

The entire contents of the patents and other publications referred to in this specification are incorporated herein by reference.

Parts List

101. Substrate
103. Anode
105. Hole-Injecting layer (HIL)
107. Hole-Transporting layer (HTL)
109. Light-Emitting layer (LEL)
111. Electron-Transporting layer (ETL)
113. Cathode
250. Current/Voltage source
260. Electrical conductors

What is claimed is:

1. An organic light emitting diode device containing a light emitting layer (LEL) comprising a host and a blue light emitting dopant wherein the dopant comprises a 2-(3-aminophenyl)-3-(alkyl, aryl, or heteroaryl)-benzofuran or 2-(4-aminophenyl)-3-(alkyl, aryl, or heteroaryl)-benzofuran compound.

2. The device of claim 1 wherein the dopant comprises a benzofuran as represented by the formula:

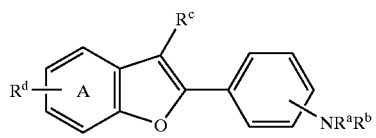

I wherein
$R^a$ and $R^b$ independently represent an aryl or heteroaryl group and the nitrogen to which they are bonded is located at the 3- or 4-position of the phenyl ring; and
$R^c$ represents hydrogen or an alkyl, aryl or heteroaryl group; and
$R^d$ represents one or more hydrogen or alkyl, substituted nitrogen, aryl or heteroaryl groups which may join to form a ring fused to ring A.

3. The device of claim 2 wherein $R^c$ represents an aryl group.

4. The device of claim 1 wherein the LEL contains a compound having the formula:

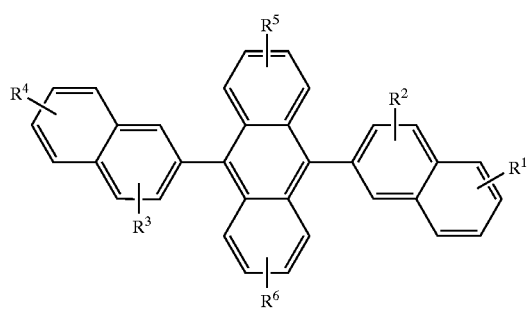

F wherein: $R^1$, $R^2$, $R^3$, $R^4$, $R^5$, and $R^6$ represent hydrogen or one or more substituents on the ring to which it is attached selected from the following groups:

Group 1: H and an alkyl or alkoxy group;
Group 2: a ring group;
Group 3: the atoms necessary to complete a carbocyclic fused ring group;
Group 4: the atoms necessary to complete a heterocyclic fused ring group;
Group 5: an alkoxyamino, alkylamino, and arylamino group; and
Group 6: fluorine, chlorine, bromine and cyano groups.

5. The device of claim 1 wherein the dopant comprises a 2-(4-aminophenyl)-benzofuran compound.

6. The device of claim 1 wherein the LEL contains a dopant in an amount of 0.01 to 20% by weight of the host.

7. The device of claim 1 wherein the LEL contains a dopant in an amount of 0.1–5.0 wt % of the host.

8. The device of claim 1 wherein the dopant comprises a benzofuran as represented by the formula:

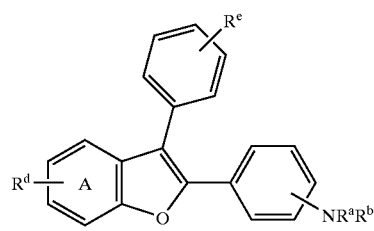

III wherein
$R^a$ and $R^b$ independently represent an aryl or heteroaryl group and the nitrogen to which they are bonded is located at the 3- or 4-position of the phenyl ring;
$R^d$ represents one or more hydrogen or alkyl, substituted nitrogen, aryl or heteroaryl groups which may form a ring fused to ring A; and
$R^e$ represents hydrogen or up to 4 groups selected from alkyl groups of from 1 to 24 carbon atoms, aryloxy, alkylamino, or arylamino groups of from 1 to 24 carbon atoms, fluorine, chlorine, bromine and cyano groups.

9. The device of claim 8 wherein the dopant comprises a benzofuran as represented by the formula:

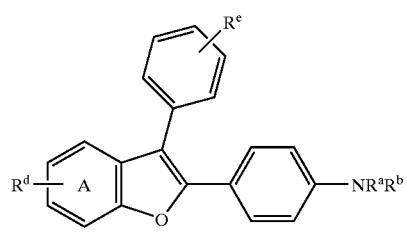

IV wherein
$R^a$ and $R^b$ independently represent an aryl or heteroaryl group;
$R^d$ represents hydrogen or up to 4 aryl or heteroaryl groups two of which may form a ring fused to ring A; and
$R^e$ represents hydrogen or up to 4 groups selected from alkyl groups of from 1 to 24 carbon atoms, aryloxy, alkylamino, or arylamino groups of from 1 to 24 carbon atoms, fluorine, chlorine, bromine and cyano groups.

10. A light emitting device containing the OLED device of claim 1.

11. A static or motion imaging device incorporating the device of claim 1.

12. A method of emitting light comprising subjecting the device of claim 1 to an applied voltage.

13. An organic light emitting diode device containing a light emitting layer (LEL) comprising a host and a blue light emitting dopant wherein the dopant comprises a 2-(3-aminophenyl)-3-(alkyl, aryl, or heteroaryl)-benzofuran or 2-(4-aminophenyl)-3-(alkyl, aryl, or heteroaryl)-benzofuran compound wherein the dopant comprises a bis-2-(4-aminophenyl)-benzofuran as represented by the formula:

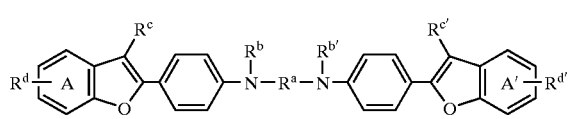

II wherein $R^a$, $R^b$, and $R^{b'}$ independently represent an aryl or heteroaryl group; and $R^c$, $R^{c'}$, independently represent an alkyl, aryl or heteroaryl group; and $R^d$, and $R^{d'}$ independently represent one or more hydrogen or alkyl, substituted nitrogen, aryl or heteroaryl groups which may form a ring fused to ring A or A'.

14. The device of claim 13 wherein $R^c$ and $R^{c'}$ are phenyl groups.

15. The device of claim 13 wherein $R^a$ is a 4,4'-biphenyl group.

16. The device of claim 14 wherein $R^a$ is a 4,4'-biphenyl group.

17. The device of claim 13 wherein $R^b$ and $R^{b'}$ are phenyl groups.

18. The device of claim 17 wherein $R^a$ is a 4,4'-biphenyl group.

19. The device of claim 15 wherein $R^c$ and $R^{c'}$ are phenyl groups.

* * * * *